(12) United States Patent
Fazan et al.

(10) Patent No.: US 6,380,599 B1
(45) Date of Patent: Apr. 30, 2002

(54) METHOD AND APPARATUS FOR TRENCH ISOLATION PROCESS WITH PAD GATE AND TRENCH EDGE SPACER ELIMINATION

(75) Inventors: Pierre C. Fazan, La Conversion (CH); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/655,001

(22) Filed: Aug. 31, 2000

Related U.S. Application Data

(60) Continuation of application No. 09/386,646, filed on Aug. 31, 1999, which is a division of application No. 09/032,231, filed on Feb. 27, 1998, now Pat. No. 6,107,157.

(51) Int. Cl.[7] .......................... H01L 29/76; H01L 29/94; H01L 31/062; H01L 31/113; H01L 11/119
(52) U.S. Cl. .................. 257/396; 257/397; 257/506; 257/510; 257/513; 257/514; 257/515; 257/412; 257/413
(58) Field of Search ................................ 257/397, 396, 257/506, 510, 513, 514, 515, 412, 413; 438/296, 297, 439, 424, 427, 435, 396, 154

(56) References Cited

U.S. PATENT DOCUMENTS

| | | | |
|---|---|---|---|
| 4,509,249 A | 4/1985 | Goto et al. ............. 29/576 W |
| 4,758,531 A | 7/1988 | Beyer et al. .................. 437/90 |
| 4,845,051 A | 7/1989 | Cogan et al. ............... 437/203 |
| 4,912,061 A | 3/1990 | Nasr .......................... 438/424 |
| 4,980,306 A | 12/1990 | Shimbo ....................... 437/34 |
| 5,137,837 A | 8/1992 | Chang et al. ................. 437/21 |
| 5,177,028 A | 1/1993 | Manning .................... 438/289 |
| 5,192,706 A | 3/1993 | Rodder ........................ 437/67 |
| 5,234,861 A | 8/1993 | Roisen et al. ................. 437/67 |
| RE34,400 E | 10/1993 | Goto et al. .................... 437/67 |
| 5,270,244 A | 12/1993 | Baliga ......................... 437/67 |
| 5,306,940 A | * 4/1994 | Yamazaki .................... 257/374 |
| 5,384,280 A | 1/1995 | Aoki et al. .................... 437/67 |
| 5,387,540 A | 2/1995 | Poon et al. .................... 437/67 |
| 5,424,240 A | 6/1995 | Han ............................. 437/67 |
| 5,436,488 A | * 7/1995 | Poon et al. ................... 257/397 |
| 5,439,850 A | 8/1995 | Ozturk et al. ............... 438/424 |
| 5,447,883 A | 9/1995 | Koyama ...................... 438/424 |
| 5,573,979 A | 11/1996 | Tsu et al. .................... 438/424 |
| 5,578,510 A | 11/1996 | Tani ........................... 438/424 |
| 5,726,479 A | 3/1998 | Matsumoto ................. 257/412 |
| 5,807,771 A | 9/1998 | Vu et al. ..................... 438/154 |
| 5,837,593 A | 11/1998 | Park et al. ................... 438/396 |
| 5,866,465 A | 2/1999 | Doan et al. ................. 438/424 |
| 5,902,127 A | 5/1999 | Park ............................ 438/435 |
| 5,923,992 A | 7/1999 | Spikes et al. ............... 438/424 |
| 6,084,289 A | * 7/2000 | Doan et al. .................. 257/632 |
| 6,130,467 A | * 10/2000 | Bandyopadhyay et al. . 257/506 |
| 6,281,103 B1 | * 8/2001 | Doan .......................... 438/593 |

* cited by examiner

*Primary Examiner*—Matthew Smith
*Assistant Examiner*—V. Yevsikov
(74) *Attorney, Agent, or Firm*—Dorsey & Whitney LLP

(57) ABSTRACT

A microelectronic device includes a field oxide isolation pad which extends from a trench formed in a microelectronic substrate by a height which is less than approximately two times the height of a gate structure formed on the microelectronic substrate. Spacers are formed around the gate structures, although little or no spacer forms around the isolation pad. The microelectronic device is fabricated by forming a gate oxide layer on a microelectronic substrate, depositing a first gate layer on the gate oxide layer, forming a trench extending through the gate layer, the gate oxide layer and into the substrate, filling the trench with a field oxide, planarizing the field oxide, recessing the field oxide to a level above the microelectronic substrate and below an upper level of the first gate layer, forming a second gate layer over the recessed field oxide and the first gate layer, forming a conductive layer over the second gate layer, forming gate structures in the conductive layer, the first and second gate layers, and the gate oxide layer, and forming spacers adjacent the gate structures.

6 Claims, 5 Drawing Sheets

METHOD AND APPARATUS FOR TRENCH ISOLATION PROCESS WITH PAD GATE AND TRENCH EDGE SPACER ELIMINATION

CROSS-REFERENCE TO RELATED APPLICATION

This application is a continuation of U.S. patent application Ser. No. 09/386,646, filed Aug. 31, 1999, which is a divisional of Ser. No. 09/032,231, filed Feb. 27, 1998, now U.S. Pat. No. 6,107,157.

TECHNICAL FIELD

The present invention relates generally to trench isolation structures on microelectronic devices and methods for forming the same, and more specifically to oxide spacers which are formed about trench isolation structures.

BACKGROUND OF THE INVENTION

Microelectronic devices are used in computers, communications equipment, televisions and many other products. Typical microelectronic devices include processors, memory devices, field emission displays and other devices that have circuits with small, complex components. In current manufacturing processes, the components of such circuits are generally formed on a microelectronic substrate or wafer with conductive, insulative and semiconductive materials. Fifty to several hundred microelectronic devices are typically formed on each microelectronic substrate, and each microelectronic device may have several million components.

Because fabricating microelectronic devices generally involves forming electrical components at a number of layers and locations, microelectronic devices generally have many conductive features to couple the various components together.

The method by which the components of an integrated circuit are interconnected involves the fabrication of metal strips that run across an oxide layer in the regions between rows of transistors. However, the strips, together with the oxide beneath the strips, form gates of parasitic MOS transistors and diffused regions adjacent the strips form sources and drain regions, respectively, of the parasitic MOS transistors. The threshold voltage of such parasitic transistors must be kept higher than any possible operating voltage so that spurious channels will not be inadvertently formed between the devices. In order to isolate MOS transistors, then, it is necessary to prevent the formation of channels in the field regions, implying that a large value of $V_T$ is needed in the field regions.

Implementing electronic circuits involves connecting isolated devices through specific electrical paths. When fabricating silicon integrated circuits it must therefore be possible to isolate devices built into the silicon from one another. These devices can subsequently be interconnected to create the specific circuit configurations desired. Isolation technology is one of the most critical aspects of fabricating integrated circuits. Hence, a variety of techniques have been developed to isolate devices in integrated circuits. These techniques balance competing requirements, such as minimum isolation spacing, area of footprint, surface planarity, process complexity, and density of defects generated during fabrication of the isolation structure.

One of the most important techniques developed is termed LOCOS isolation (for LOCal Oxidation of Silicon), which involves the formation of a semi-recessed oxide in the nonactive (or field) areas of the substrate for use with PMOS and NMOS integrated circuits. Conventional LOCOS isolation technologies reach the limits of their effectiveness as device geometries reach submicron size. Modified LOCOS processes such as trench isolation have had to be developed to deal with these smaller geometries.

Refilled trench structures have been used as a replacement for conventional LOCOS isolation techniques. Trench/refill approaches for isolation applications generally fall into the following three categories: shallow trenches (less than 1 micron); moderate depth trenches (1–3 micron); and deep, narrow trenches (greater than 3 micron deep, less than 2 micron wide). Shallow, refilled trenches are used primarily for isolating devices of the same type, and hence they can be considered as replacements for LOCOS isolation. An example of a shallow trench isolation structure is shown in FIG. 1.

The conventional shallow trench isolation structure 10 shown in FIG. 1 is fabricated on a microelectronic substrate 20. Gate structures 100 and 300 are formed on the substrate 20 from a pad/gate oxide layer 30, a first gate layer 40, a second gate layer 70 and a silicide layer 80. A trench 22 formed in the substrate 20 is filled with a silicon oxide 60, to form the shallow trench isolation structure or isolation pad 400. An isolated component 200 is fabricated on the isolation pad 400, the isolated component 200 comprising the second gate layer 70 and the silicide layer 80. Oxide spacers 91–94 are then formed about the gate structures 100 and 300, the isolated component 200 and the isolation pad 400. The oxide spacers 91–94 protect the components from contact with other conductive components, as well as, providing gentle slopes to improve step coverage when applying additional layers. Generally, the less severe the slope, the better the coverage.

Due to the need to define gentle slopes from the relatively tall gate structures 100, 300, the isolated component 200, and the isolation pad 400, the spacers 91–94 take up a large amount of area on the microelectronic substrate 20. Continued progress in microelectronic fabrication requires that isolation structures be as small as possible and take up a minimum of area on the microelectronic substrate. Any reduction in the size of the isolation structures will provide great benefits in semiconductor manufacture.

SUMMARY OF THE INVENTION

A reduction in the size of isolation shallow trench structures and associated gates is achieved by the elimination of spacers about the isolation pad and the reduction in the area occupied by spacers around the associated gate structures and the isolation component. The elimination of the spacer around the isolation pad, and the reduction in size of the other spacers is achieved by controlling the height by which the isolation pad extends from the substrate.

In a first exemplary embodiment, the isolation pad is recessed to a level which is between an upper level of the first gate layer and an upper level of the substrate of the microelectronic substrate.

In a second embodiment, the height of the isolation pad is controlled relative to the height of the gate structure by ensuring that the gate structure is at least approximately twice the height of the height by which the isolation pad extends beyond the substrate. Likewise, spacer size can be controlled by ensuring that the isolation pad extends beyond the substrate by a height which is less than approximately one half of the height of the gate structure.

Controlling the relative heights of the isolation pad relative to the gate structures or the isolated component is accomplished by recessing the isolation pad during the fabrication process.

In one exemplary embodiment of the fabrication process, the gate oxide layer is grown on the microelectronic substrate. The first gate layer is deposited on the gate oxide layer and the trench is formed through the gate layer and the gate oxide layer and into the substrate. The trench is then filled with the silicon oxide, and the structure is planarized through chemical-mechanical planarization (CMP). The field oxide is then recessed to an appropriate depth. It is this recess step which controls the later spacer formation. After recessing, the second gate layer is deposited over the recessed field oxide and the first gate layer. The silicide layer is then formed over the second gate layer and gate structures and the isolated component are formed in the silicide layer, the first and second gate layers, and the gate oxide layer. Spacers are formed about the resulting gate structures and the isolated component.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with microelectronic devices and with the fabrication of microelectronic devices, and isolation structures in microelectronic devices, have not been shown in detail in order to avoid unnecessarily obscuring the description of the embodiments of the invention.

Figure 2H:
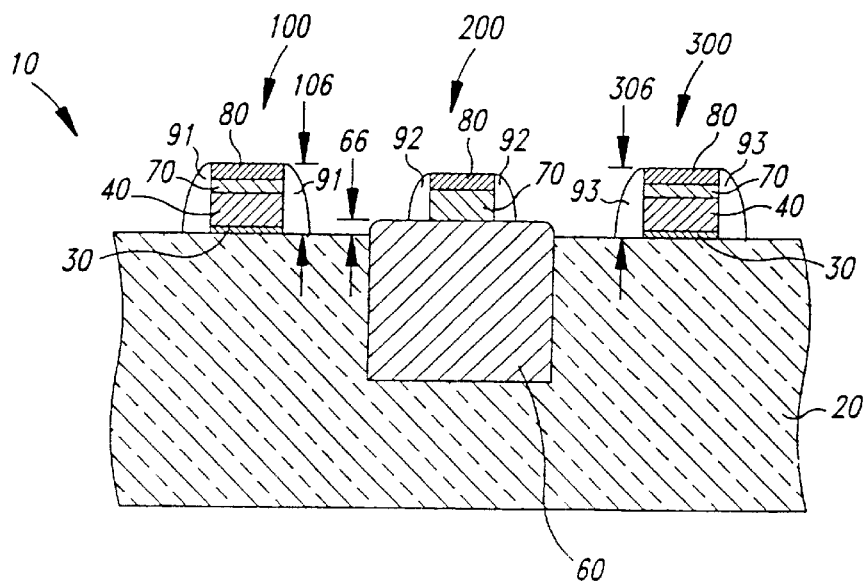
FIGS. 2A–2H are cross-sectional views showing respective steps of a method for the fabrication of a shallow trench isolation structure in a microelectronic substrate, according to an exemplary embodiment of the present invention.
Figure 1:
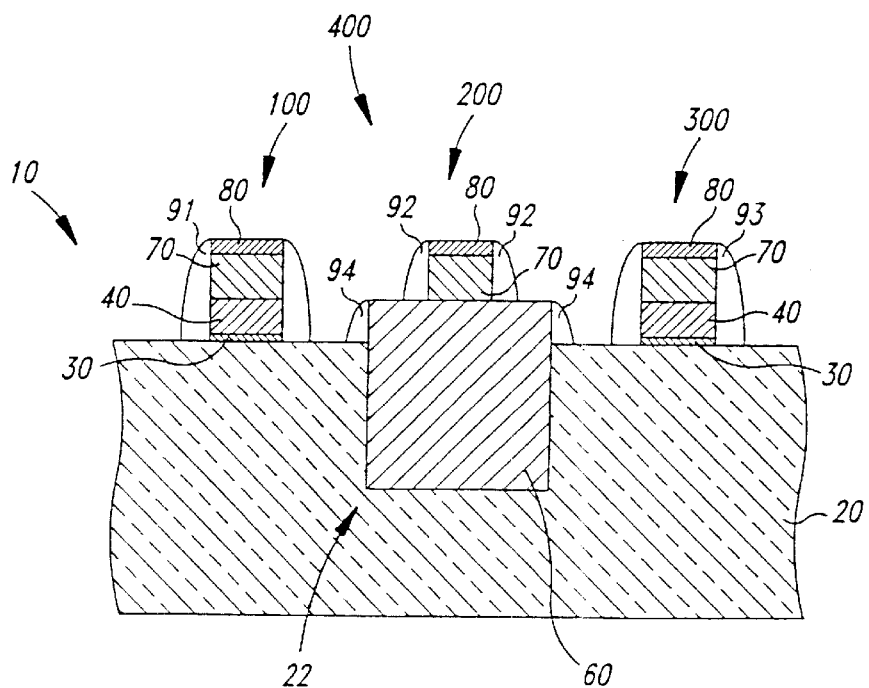
FIG. 1 is a cross-sectional view showing a conventional method for the fabrication of a shallow trench isolation structure having spacers.
Figure 2A:
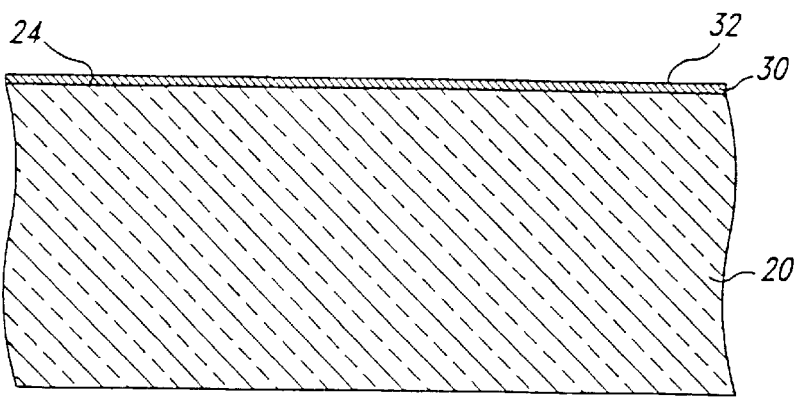
Figure 3:
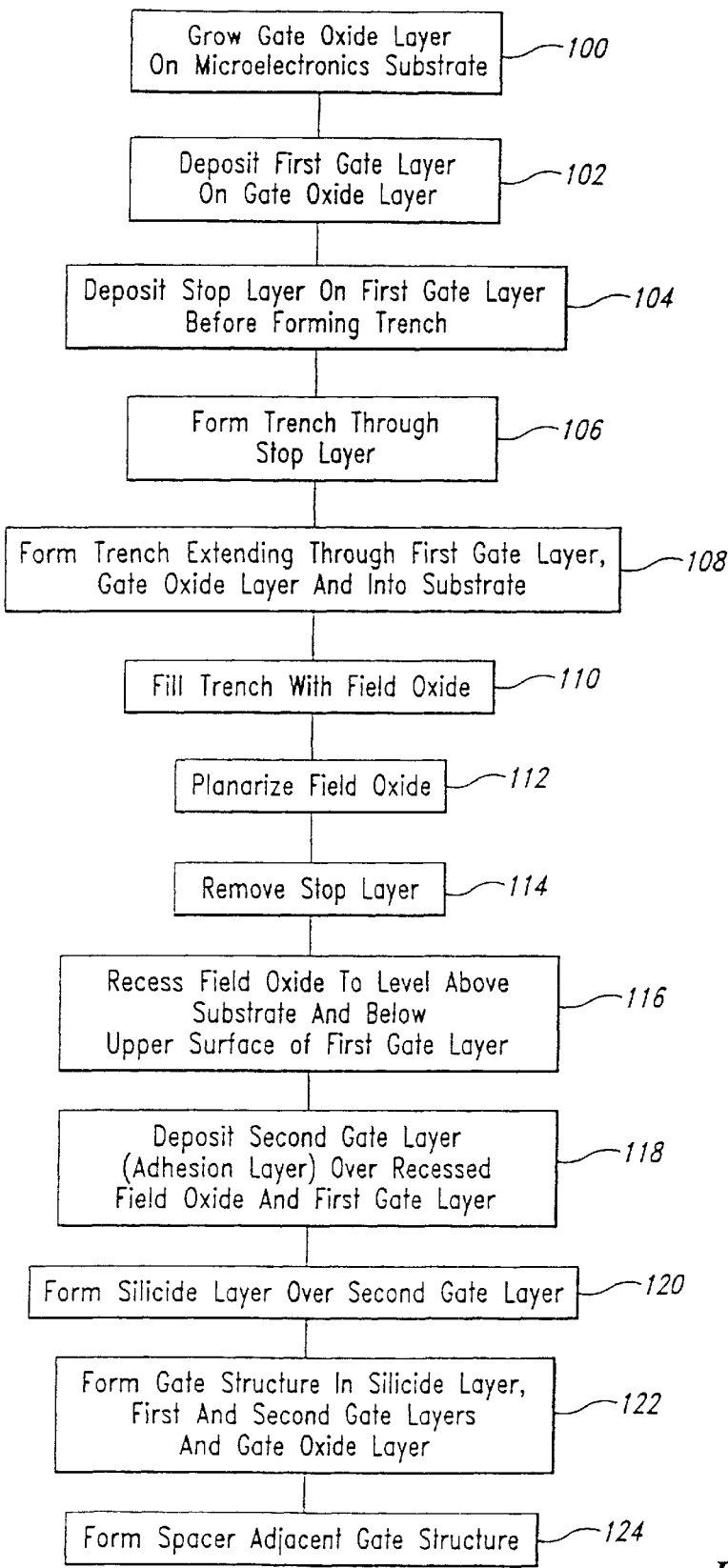
FIG. 3 is a flow chart of the method steps in the exemplary embodiment of FIGS. 2A–2G.

With reference to FIGS. 2A and 3, a pad oxide or gate oxide layer 30 is formed on a surface 24 of a microelectronic substrate 20 in step 100. The gate oxide layer 30 has an exposed upper surface 32. The substrate 20 may be formed of glass or other suitable material, but is preferably formed of silicon. The gate oxide layer 30 may be formed by first cleaning a bare silicon surface of substrate 20 and then thermally growing a $SiO_2$ layer thereupon. Other techniques for forming the gate oxide layer 30 may be used, such as CVD $SiO_2$ deposition.

Figure 2B:
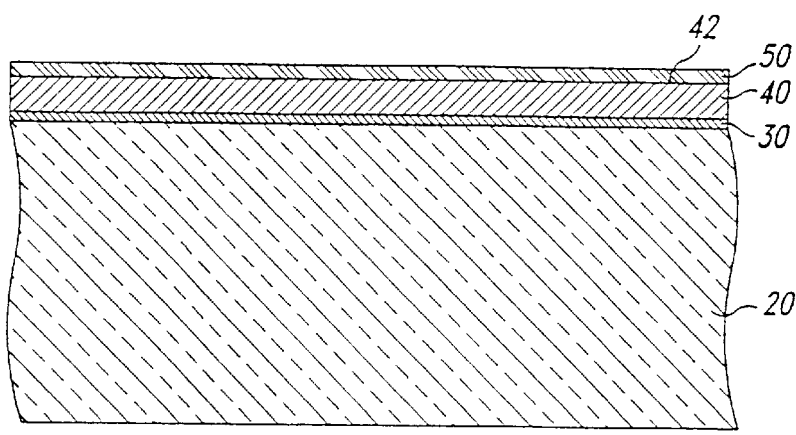

With reference to FIGS. 2B and 3, a first gate layer 40 is deposited over the gate oxide layer 30 in step 102. The first gate layer 40 has an upper surface 42. The first gate layer 40 preferably consists of polysilicon. A nitride stop layer 50 may optionally be formed over the first gate layer 40 in step 104. The stop layer 50 may be CVD silicon nitride which functions as an oxidation mask.

Figure 2C:
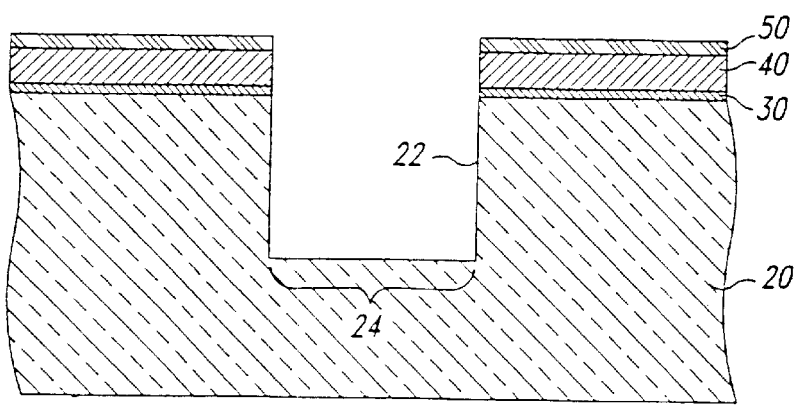

With reference to FIGS. 2C and 3, in steps 106 and 108, a trench 22 is formed, the trench 22 extending through the stop layer 50, the first gate layer 40, the gate oxide layer 30 and into the substrate 20. The trench 22 defines a field area 24 in the substrate 20. A thin layer (100–200 Å) of silicon dioxide ($SiO_2$) is then thermally grown on the exposed silicon (Si).

Figure 2D:
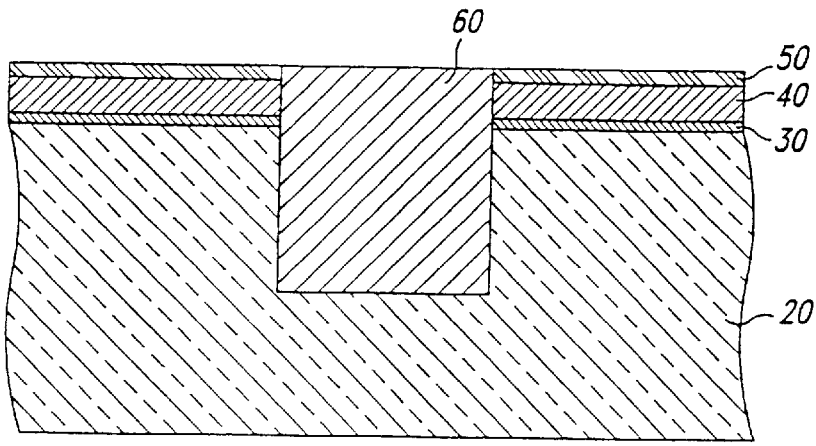

With reference to FIGS. 2D and 3, the trench 22 is filled with silicon oxide to form a field oxide 60 in step 110. Silicon oxide can be deposited using conventional techniques such as LPCVD, HDPCVD (high density plasma CVD), etc. Conventional processes may be used to reduce or eliminate the birds beak which often results from field oxide growth. Chemical-mechanical planarization (CMP) is then used to planarize the field oxide 60 in step 112. In general, CMP involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. If the optional stop layer 50 is formed, the stop layer 50 will normally determine the endpoint of the CMP step 112. The stop layer 50 is then removed in step 114 by conventional means.

Figure 2E:
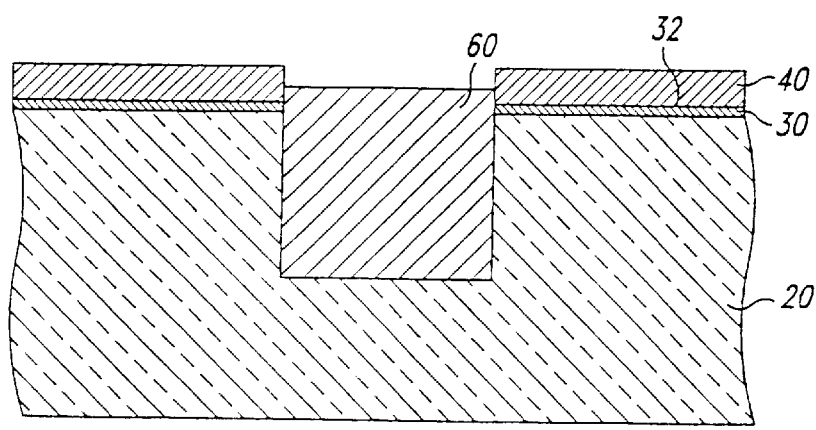

With reference to FIGS. 2E and 3, the field oxide 60 is recessed in step 116 such that the surface of the field oxide 60 is at a level between the level of the upper surface 42 of the first gate layer 40 and the surface 24 of substrate 20. In the exemplary embodiment, the field oxide level is between the upper surface 42 of the first gate layer 40 and the upper surface 32 of the gate oxide layer 30.

Figure 2F:
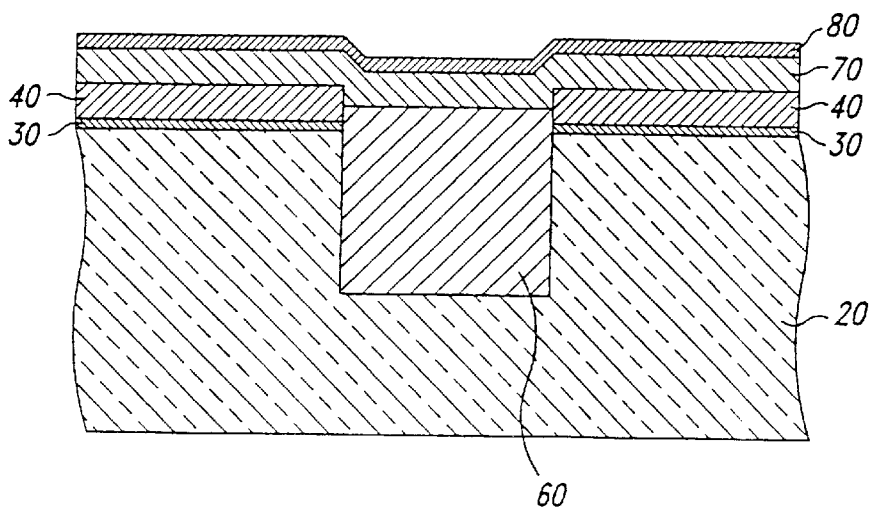

With reference to FIGS. 2F and 3, a second gate layer 70 may be formed on the recessed field oxide 60 and the first gate layer 40 in step 118. The second gate layer 70 serves as an adhesion layer. The second gate layer 70 is preferably composed of polysilicon. The second gate layer 70 can be formed by conventional deposition methods.

A conductive layer 80 is then formed over the second gate layer 70 in step 120. The conductive layer 80 may be formed by chemical vapor deposition of tungsten silicide ($WSi_x$). Other refracting metal suicides may be used, including, but not limited to $TiSi_2$, $TaSi_2$, $MoSi_2$, $PtSi$. A thin layer of oxide may optionally be formed on the silicide layer 80.

Figure 2G:
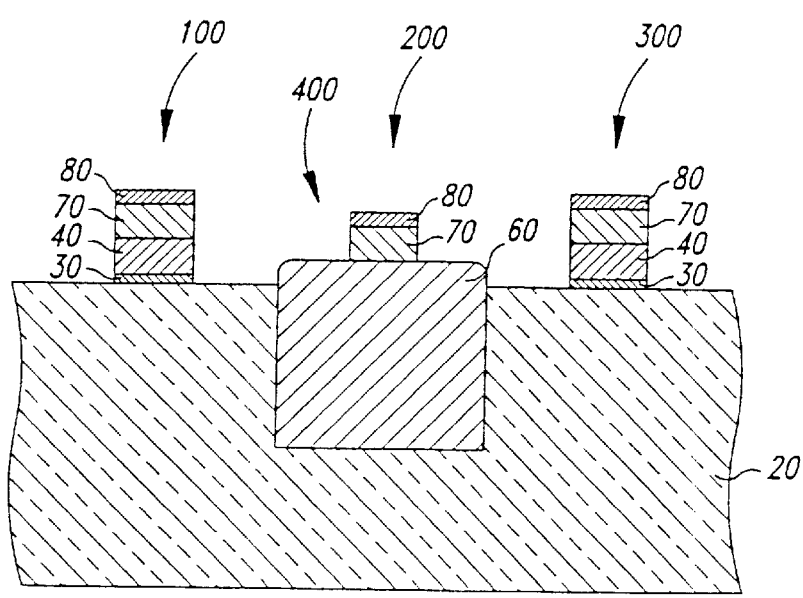

Gate structures 100, 300 are next formed in the silicide conductive layer 80, the first and second gate layers 40, 70 and the gate oxide layer 30 in step 122 as shown in FIG. 2G. The shallow trench isolation structure 400 may also be uncovered at this point. The gates 100, 300 are formed through conventional patterning and etching processes. The isolated component 200 may also be formed at this point.

With reference to FIGS. 2H and 3, spacers 91 and 92 are formed about the gate structures 100 and 300, respectively, and spacer 92 is formed about the isolated component 200 in step 124. Formation of the spacers may be carried out in a number of ways including deposition of $LPCVD-SiO_2$. The spacers 91–93 are grown until an adequate reduction of step size is achieved. Due to the relatively low profile of the isolation pad 400, little or no spacer will form adjacent to the isolation pad 60. To achieve this, the field oxide isolation pad height 66 should be approximately one half of the height of the gate structure 106, 306, an approximately two-to-one ratio.

Although specific embodiments of the shallow trench isolation structure and method of the present invention have been described above for illustrative purposes, various equivalent modifications may be made without departing from the spirit and scope of the invention, as will be recognized by those skilled in the relevant art. The teachings provided herein of the present invention can be applied to other isolation structures, not necessarily the exemplary shallow trench isolation structure generally described above. For example, additional layers may be formed or order of forming layers may be changed. The substrate may be composed of silicon, glass or some combination of other materials or layers of materials. Alternatively, different materials may be employed, and different methods of forming or depositing the layers may be used.

These and other changes can be made to the invention in light of the above detailed description. In general, in the following claims, the terms should not be construed to limit the invention to the specific embodiments disclosed in the specification claims, but should be construed to include all apparatus and methods for forming trench isolation structures with reduced and eliminated spacers. Accordingly, the invention is not limited by the disclosure, but instead its scope is to be determined entirely by the following claims.

What is claimed is:

1. A microelectronic device, comprising:

a microelectronic substance having a surface with a trench formed therein;

an isolation pad formed within the trench and having sides that are substantially straight and substantially parallel from a bottom of the trench to a top surface of the isolation pad, the substantially straight sides projecting therefrom substantially perpendicular to the surface of the substrate by a pad height which is small enough to prevent the formation of spacers adjacent the isolation pad, the isolation pad not extending laterally from the trench over the surface of the substrate; and a component formed on the isolation pad.

2. The microelectronic device according to claim 1 wherein the isolation pad comprises a field oxide pad.

3. The microelectronic device according to claim 1 wherein the component comprises a gate structure.

4. The microelectronic device according to claim 3 wherein the gate structure comprises a gate oxide layer formed on the microelectronic substrate, and a first gate layer formed on the gate oxide layer.

5. The microelectronic device according to claim 1 wherein at least one component is formed on the microelectronic substrate, and the pad height is less than or equal to approximately one half of a height of the component formed on the microelectronic substrate.

6. The microelectronic device according to claim 1, further comprising at least one spacer formed on the isolation pad adjacent the component.

* * * * *